June 9, 1964 R. SCHRAIVOGEL 3,136,961

ARRANGEMENT FOR CONVERTING A CONTROL POTENTIAL INTO PULSE-WIDTH-MODULATED RECTANGULAR IMPULSES

Filed Nov. 1, 1960

United States Patent Office 3,136,961

Patented June 9, 1964

3,136,961

ARRANGEMENT FOR CONVERTING A CONTROL POTENTIAL INTO PULSE-WIDTH-MODULATED RECTANGULAR IMPULSES

Rainer Schraivogel, Imfangring 5, Lucerne, Switzerland

Filed Nov. 1, 1960, Ser. No. 66,607
Claims priority, application Switzerland Nov. 5, 1959
10 Claims. (Cl. 332—15)

The invention relates to an arrangement for converting a control potential into pulse-width-modulated rectangular impulses.

In control technology the requirement often occurs for amplifying a relatively small measuring value, which for example may represent an error magnitude. For this a so-called control amplifier is necessary which exerts the required control on a setting member. The measurement magnitudes are in general D.C. values, especially D.C. potentials, and an accurate reproduction of a represented magnitude by a measuring value generator or converter is often only possible if a predetermined loading of the same is not exceeded. For avoiding such overloading, attempts have been made to use control amplifiers having high input resistances. The required high input resistances are not readily available, however, if magnetic amplifiers or so-called amplifying machines are used. Attempts have therefore been made to use a pre-amplifier with as high an input resistance as possible. Known amplifiers having this feature are electron tube amplifiers. The use of these in industrial control installations is undesirable however, due to their mechanical sensitivity, tendency to age, and heater requirements.

It has been proposed to use semi-conductor amplifiers. The abovementioned disadvantages of electron tubes are not present with transistors and other semi-conductor amplifiers, but the difficulty arises that owing to their low dissipation semi-conductor amplifiers are in general only controllable up to predetermined relatively low output power. Magnetic amplifiers and amplifying machines, considered from the techno-economic viewpoint, can not generally be satisfactorily controlled by semi-conductor amplifier arrangements.

Furthermore, magnetic amplifiers have been proposed, which have particularly low input power requirements. However, their time constant is so large that they can not be used for rapid technical control purposes.

The dissipative power of a semi-conductor amplifier in an uncontrolled and in a completely controlled condition is essentially lower than at other, intermediate, control values, such as the middle of the control range. It is therefore desirable to pass through the intermediate range as quickly as possible, so that the amplifier element is predominantly in either the blocked or open condition and the dissipation occurring in the time of control change thus only arises during a very short period so that excessive heating and disturbance is avoided. It is thus possible to achieve a higher efficiency if transistors are used as switches. The control is in this case effected in dependence on an off/on relationship. For controlling the switching transistors, rectangular impulses are required which have a variable width relationship. The greater the flank steepness of the rectangular impulses, the faster is the transit through the dangerous region for the semi-conductor.

Circuits have been proposed in which a pulse-width-modulation is achieved in such a manner that an amplifier having a small range of input potential is controlled for example by a triangular-shaped potential with relatively large amplitude. By increasing and decreasing this triangular-shaped potential in respect of the operating range of the amplifier, there arises at the output a series of impulses of controlled width. Circuits of this nature have the disadvantage that for controlling over the complete range, a control potential is needed which is essentially larger than the range of input potential of the amplifier used. For applications in which only very small control potentials arise, this is a disadvantage, since a D.C. amplifier gives rise to considerable difficulty. A further disadvantage of such circuits is that the functioning of the modulation may be strongly influenced by disturbing impulses which may arise, whereby an undesired intense smoothing of the control potential may become necessary.

It is an object of the invention to provide an arrangement in which the abovementioned disadvantages are avoided, or at least reduced.

The invention provides apparatus for converting a control potential into pulse-width-modulated rectangular impulses, comprising means for converting the control potential into impulses of corresponding amplitudes and first means for amplifying the said impulses without transfer of a D.C. component, means being provided for charging a condenser by the amplified impulses, and discharging the condenser to a fixed rest potential during the pauses between impulses, whereby to form a saw-tooth shaped condenser potential with the relationship between the saw-tooth bases and the period time being dependent on the control potential, second amplifying means being provided for converting the said condenser potential into rectangular impulses of controlled width. The converting means may comprise a modulator arranged for being fed with the control potential and with impulses from an impulse generator, the modulator being connected by an amplifier constituting the said first amplifying means to a further modulator of which the said condenser forms part. The converting means may be so arranged as to sample the control potential for a short time at periodic intervals controlled by the impulse generator, whereby to create impulses the amplitude of which corresponds to the magnitude of the control potential at the instant of sampling.

The means for discharging the condenser during the pauses between impulses may comprise a discharge resistance, the discharging means being so arranged as to discharge the condenser at a substantially constant current. Means may be provided for supplying as control potential, a combination of a nominal value potential and a potential representing a difference between the nominal potential and an actual potential of a regulating circuit. The said means may be arranged for supplying at least one of the said combined potentials in the form of an A.C. potential of constant frequency with which the impulses from the impulse generator are synchronized.

The modulator arranged for being fed with the control potential may comprise a crystal triode the input of which is connected to the impulse generator. The further modulator may comprise the base-emitter path of a transistor and the said condenser, a base leak resistor of the transistor serving for discharging the condenser. A Schmitt trigger arrangement may be connected to the collector of the transistor.

In order to make the invention clearly understood, reference will be made to the accompanying drawings which are given by way of example and in which.

Figure 1:
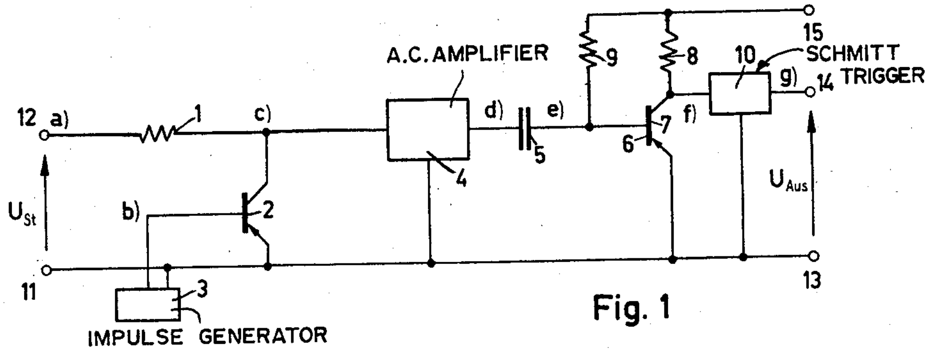
FIG. 1 is a circuit diagram of an embodiment of the invention.

A control potential is applied to terminals 11 and 12 of the circuit of FIG. 1. This potential passes over a resistor 1 to a transistor 2 to the input of which impulses from an impulse generator 3 are fed. The signal is amplified in an A.C. amplifier 4, without the D.C. component being transferred, and serves for charging a condenser 5 over the the base-emitter path 6 of a further transistor 7. The condenser 5 discharges over a base-leak resistor 9 of the transistor 7.

A collector resistor 8 of the transistor 7 is connected to a supply potential terminal 15, the base of the transistor 7 being connected to the condenser 5. From the collector of the transistor 7 the signal is fed to a Schmitt trigger 10 from which it can be taken off by output terminals 13 and 14.

The arrangement described operates as follows:

The control potential applied to the terminals 11 and 12 feeds the transistor 2 over the resistor 1. Rectangular sampling impulses are fed to the base of the transistor 2 from the impulse generator 3, the pulse ratio of the sampling impulses being small and constant. By "pulse ratio" is to be understood the quotient $a/T$ of the impulse period T and the impulse width $a$ (see FIG. 2). The transistor 2 serves in this case as a modulator. If for example a positive impulse reaches the base of the transistor 2, then during the entire impulse duration the transistor is blocked so that from the control potential, which simultaneously represents the collector potential of the transistor 2, a portion is cut out which retains the amplitude of the impulse on the collector. Thus the amplitude of the impulse is proportional to the applied control potential. As soon as the impulse on the base of the transistor 2 ceases, the transistor conducts, this corresponding to a short circuit across the transistor. During this time, therefore, there arises no impulse on the collector which could be further used. The rectangular impulses, modulated in amplitude, which are thus obtained are now further amplified in the A.C. amplifier 4, the D.C. component being not transferred.

The amplified impulses pass to a second modulator which is formed by the condenser 5 and the base-emitter path 6 of the second transistor 7. The condenser 5 receives a charging current during the duration of the sampling impulses, which renders the base-emitter path 6 of the transistor 7 conducting, so that the condenser potential at the end of the sampling impulse is proportional to the applied control potential. The supply of the second transistor 7 is effected from a D.C. source through the terminal 15 and the collector resistor 8. Immediately after a sampling impulse interval the condenser potential appears in the blocking direction on the base-emitter path and decays, by discharge of the condenser through the base-leak resistor 9, to a value at which the transistor 7 again conducts. Thus the instant at which the transistor 7 again begins to conduct is determined by the magnitude of the condenser potential at the end of the sampling impulse. The transistor 7 thus functions on the one hand with its base-emitter path as a modulator and on the other hand as an amplifier.

At the collector of the second transistor 7, rectangular impulses arise with a "pulse-ratio" proportional to the control potential. The flank steepness of the rectangular impulses is however not sufficient to ensure a satisfactory operation. In order that the dangerous range outside the working hyperbola of the transistor may be quickly passed through, a high flank steepness is necessary. Therefore, at the output of the second amplifier a Schmitt trigger 10, or alternatively an over-controlled amplifier, is provided. At the terminals 13 and 14 a pulse-width-modulated rectangular potential having the "pulse-ratio" $b/T$ (FIG. 2) is derived.

Figure 2:
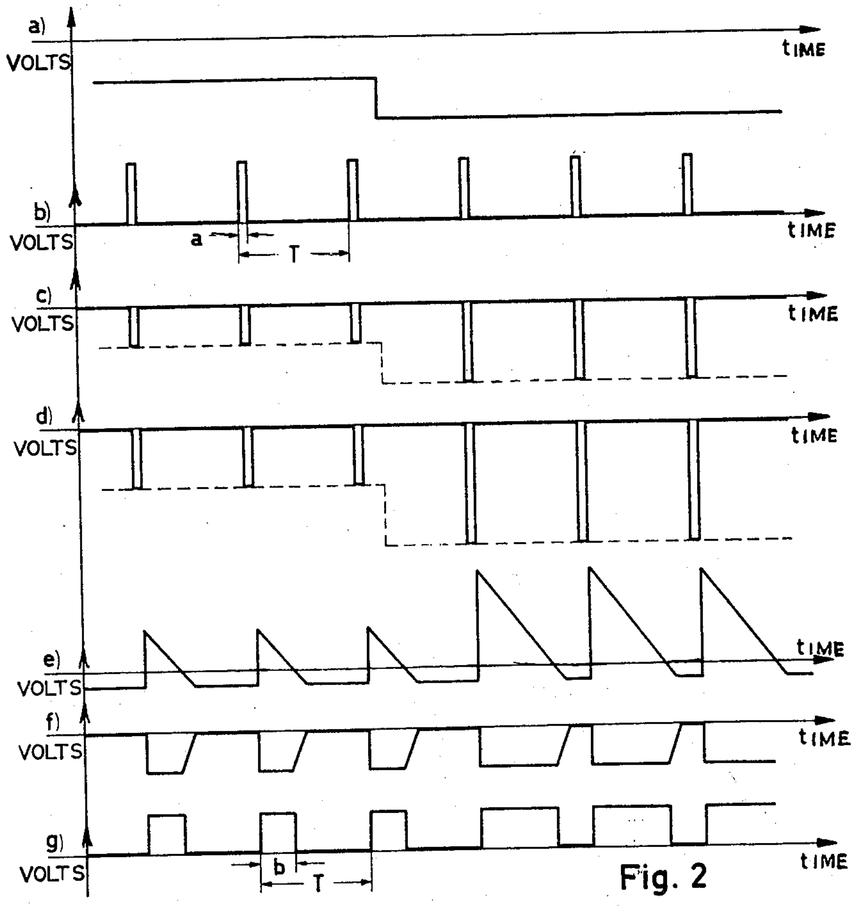
FIG. 2 is a graphical illustration of potentials at various points in the circuit of FIG. 1.

In FIG. 2 the potential characteristics at various points $a$ to $g$ of FIG. 1 are illustrated, assuming that the discontinuous function $a$ (FIG. 2) is applied to the input terminals 11 and 12 of FIG. 1.

The arrangement described may be used for various regulating and controlling purposes, for example the control of rectifier circuits which comprise controllable semiconductors or gas discharge tubes, the low-lose control of a controllable semi-conductor by the principle of pulse-width-modulation, or the controlled feed of the field of a D.C. machine or the control winding of a magnetic amplifier.

In the arrangement of the invention, the control potential passes into the circuit only during the relatively short sampling impulses. Such an arrangement may also thus be used with advantage if the control potential consists of a D.C. component and an A.C. component and the "pulse-ratio" is to be controlled by the difference between the D.C. component and the amplitude of the A.C. component. It is also possible with this circuit to use as control potential an A.C. potential with a variable phase position. In both cases, the impulse generator should be synchronous with the A.C. potential. By means of the above described circuit, the transfer of D.C. components in semi-conductor amplifier is prevented.

What I claim is:

1. An arrangement for converting a control potential into pulse-width-modulated rectangular impulses, comprising means for converting the control potential into impulses of corresponding amplitudes, first means for A.C. amplifying said impulses, a condenser, means for charging said condenser by the amplified impulses, and means for discharging said condenser to a fixed rest potential during the pauses between impulses to form a saw-tooth shaped condenser potential with the relationship between the saw-tooth bases and the period time being dependent on the control potential, and second amplifying means being provided for converting the said condenser potential into rectangular impulses of controlled width.

2. An arrangement as claimed in claim 1, including an impulse generator wherein the converting means comprise a modulator for receiving the control potential and impulses from said impulse generator.

3. An arrangement as claimed in claim 2, wherein the converting means samples the control potential for a short time at periodic intervals controlled by said impulse generator for creating impulses having amplitudes which correspond to the magnitude of the control potential at the instant of sampling.

4. An arrangement as claimed in claim 2, wherein the means for discharging the condenser during the pauses between impulses comprise a discharge resistance, said discharging means being so arranged as to discharge the condenser at a substantially constant current.

5. An arrangement as claimed in claim 2, wherein means are provided for supplying, as control potential, a combination of nominal value potential and a potential representing a difference between the nominal value potential and an actual potential of a regulating circuit.

6. An arrangement as claimed in claim 5, wherein the said means are arranged for supplying at least one of the said combined potentials in the form of an A.C. potential of constant frequency with which the impulses from the impulse generator are synchronized.

7. An arrangement as claimed in claim 2, wherein the modulator arranged for being fed with the control potential comprises a crystal triode the input of which is connected to the impulse generator.

8. An arrangement as claimed in claim 2, wherein the second amplifying means comprises a transistor including a base, an emitter and a collector, and a base lead resistor, the base emitter path of said transistor being connected to said condenser, the base lead resistor of said transistor serving for discharging said condenser.

9. An arrangement as claimed in claim 8, wherein a Schmitt trigger arrangement is connected to the collector of the transistor.

10. Apparatus for generating impulses having time durations proportional to the amplitude of a received control voltage comprising first means for converting the received control voltage into a plurality of impulses having a fixed time duration and a given repetition rate and an amplitude proportional to the amplitude of the received control voltage, second means for converting the plurality of impulses into a sawtooth waveform having a repetition rate equal to said given repetition rate and the amplitudes of each sawtooth being equal to the amplitudes of one of said plurality of impulses by starting said each sawtooth at a level equal to the amplitude of the associated impulse, and third means for clipping the extreme portions of said sawtooth waveform to provide a truncated sawtooth waveform.

References Cited in the file of this patent

UNITED STATES PATENTS 2,824,287 Green et al. ............. Feb. 18, 1958

FOREIGN PATENTS 793,167 Great Britain ........... Apr. 9, 1958